United States Patent [19]

Hovel et al.

[11] 4,178,195

[45] Dec. 11, 1979

[54] SEMICONDUCTOR STRUCTURE

[75] Inventors: Harold J. Hovel, Katonah; Jerry M. Woodall, Mt. Kisco, both of N.Y.

[73] Assignee: International Business Machines Corporation, Armonk, N.Y.

[21] Appl. No.: 918,114

[22] Filed: Jun. 22, 1978

Related U.S. Application Data

[62] Division of Ser. No. 744,012, Nov. 22, 1976, Pat. No. 4,122,476.

[51] Int. Cl.$^2$ .......................................... H01L 21/208
[52] U.S. Cl. ..................................... 148/171; 148/172; 148/187; 136/89 SG; 29/572; 357/16
[58] Field of Search ....................... 148/171, 172, 187; 29/572; 357/16; 136/89 SG

[56] References Cited

U.S. PATENT DOCUMENTS

| | | | |
|---|---|---|---|
| 3,631,836 | 1/1972 | Jarvela et al. ................... | 148/172 X |
| 3,874,952 | 4/1975 | Woodall ............................... | 148/171 |
| 3,891,478 | 6/1975 | Ladany et al. ................... | 148/172 X |
| 4,012,242 | 3/1977 | Matare ............................. | 148/171 X |

*Primary Examiner*—G. Ozaki
*Attorney, Agent, or Firm*—Alvin J. Riddles

[57] ABSTRACT

A technique for fabricating a semiconductor heterostructure by growth of a ternary semiconductor on a binary semiconductor substrate from a melt of the ternary semiconductor containing less than saturation of at least one common ingredient of both the binary and ternary semiconductors wherein in a single temperature step the binary semiconductor substrate is etched, a p-n junction with specific device characteristics is produced in the binary semiconductor substrate by diffusion of a dopant from the melt and a region of the ternary semiconductor of precise conductivity type and thickness is grown by virtue of a change in the melt characteristics when the etched binary semiconductor enters the melt.

10 Claims, 5 Drawing Figures

SEMICONDUCTOR STRUCTURE

The invention described herein was made in performance of work under NASA Contract No. NAS-1-12812 and is subject to the provisions of Section 305 of the National Aeronautics and Space Act of 1958 (72 STAT 435, 42 USC 2457).

This is a divisional application of application No. Ser. No. 744,012 filed Nov. 22, 1976 now U.S. Pat. No. 4,122,476.

BACKGROUND OF THE INVENTION

Semiconductor heterostructures have been receiving attention in the art because of the added capabilities in device parameters that are made available to the device designer using these structures. As the art is developing, devices are appearing involving not only electrical conduction properties but also photoelectric conversion properties. Where both of these properties are employed in the same structure new considerations become involved in the operating regions of the device. For example, thicknesses of regions may effect not only carrier transport but also waveguide properties and transparency to light and a p-n junction may require not only electrical conduction front-to-back ratios but also the junction may require particularly good minority carrier diffusion adjacent thereto for optical efficiency. The semiconductor heterostructures and the techniques by which they have been fabricated have not yielded as great a control as the development of the art could use.

SUMMARY OF THE INVENTION

The invention relates to a semiconductor structure made by a technique of alloying, diffusion and regrowth from the alloy whereby a substrate of a binary semiconductor one conductivity type is brought into contact with an alloy of a ternary semiconductor having ingredients in common with those of the binary semiconductor and which is unsaturated with respect to the at least one of the ingredients of the binary semiconductor and which further includes a conductivity type determining impurity opposite that in the binary semiconductor member at a temperature sufficient to permit etching of part of the binary semiconductor substrate material, and growing at the same temperature out of the same alloy melt, which has now changed character due to the material etched from the binary semiconductor substrate, a region of the ternary semiconductor of the opposite conductivity type to that of the substrate. If the conductivity type determining impurity is one that diffuses readily then the alloy may be kept in contact for a sufficient time to permit the impurity to form a p-n junction in the binary semiconductor and to lengthen the minority carrier lifetime in the binary semiconductor adjacent to the p-n junction. The technique provides control of such parameters as region thickness and bandgap gradient, conductivity magnitude, p-n junction positioning and parallelism, and minority carrier diffusion length adjacent to and within a p-n junction.

DETAILED DESCRIPTION

Figure 1:
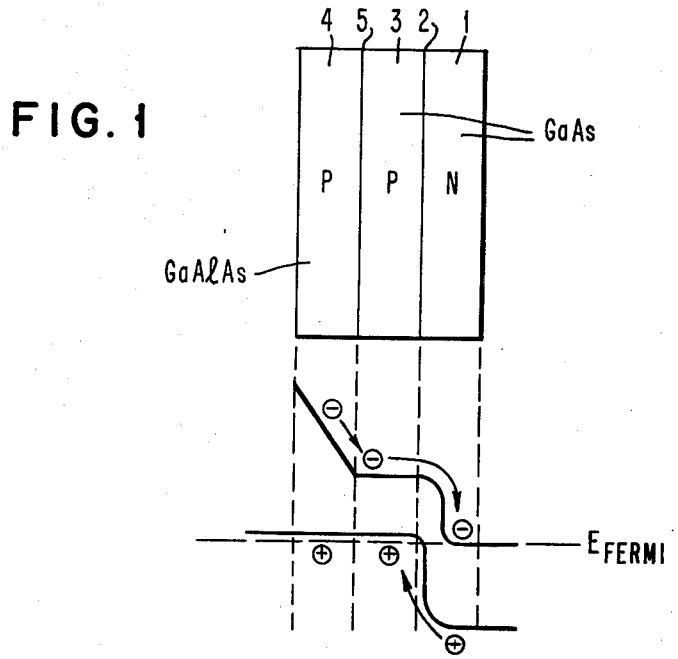
FIG. 1 shows an embodiment of the structure made in accordance with the invention with a correlated energy diagram.

Referring to FIG. 1 an illustrative embodiment structure in accordance with the invention is shown with specific selected materials to show specific properties.

The structure of FIG. 1 is made up of a substrate 1 of a semiconductor material with a first conductivity type for example, n-type GaAs. Contiguous therewith at a p-n junction 2 is a region of the same material as the substrate 3 of opposite conductivity type for example, p-type GaAs. A region 4 of a ternary semiconductor material with a graded band-gap is shown contiguous with the region 3 at a transition line 5. The region 4 may for example, be p-type $Ga_{1-x}Al_xAs$.

The performance of electrons and holes in the structure of FIG. 1 may be seen from the energy level diagram in the figure that is correlated with the regions of the structure. In this diagram it will be seen that electrons identified by the symbol (−) are urged across the p-n junction 2 by the drift field produced by the graded bandgap in the region 4. The holes identified by the symbol (+) move across the p-n junction 2 to an energy position adjacent the fermi level.

The electrons photoproduced in region 4 identified by the symbol (−) are urged across the p-n junction by the graded bandgap of region 4. This same graded bandgap also prevents electrons in region 3 from diffusing to the surface of region 4 where they could be lost.

The movement of the holes (+) and electrons (−) together give rise to the photocurrent of the device. For a solar cell this current is commonly referred to as short circuit current.

The structure of FIG. 1 is produced by contacting a binary semiconductor substrate of a particular conductivity type for example, n-type GaAs with a ternary semiconductor melt with several characteristics. The melt contains the ingredients of a ternary semiconductor material and is capable of forming an alloy with the binary semiconductor at a temperature lower than the melting temperature of the binary semiconductor substrate, it contains a conductivity type determining impurity capable of converting the binary semiconductor substrate by diffusion. The concentrations are such that at a temperature less than the melting temperature of the binary semiconductor substrate the melt is not saturated with the ingredients of the binary semiconductor and etches away a portion of the binary semiconductor substrate. The conductivity type determining impurity diffuses into the binary semiconductor substrate to form the p-n junction 2.

The duration of the time at the alloying temperature for the positioning of the p-n junction is governed by the diffusion coefficient of the impurity involved, its concentration, the atomic spacing of the substrate and the temperature. The melt proportions are selected such that the dissolved binary semiconductor substrate material that is etched, alters the melt characteristics, so that material of the ternary semiconductor is epitaxially grown on the binary semiconductor substrate. Since the melt contains a conductivity type determining impurity the region 4 will have a conductivity type corresponding to that impurity. Further since the ternary melt proportions are preselected, these proportions can be arranged so that as the ternary semiconductor in the region 4 grows its composition changes with distance producing the graded bandgap providing the drift field shown in the energy diagram of FIG. 1. The alloy is kept in contact for a longer time which operates to greatly lengthen the minority carrier diffusion length adjacent to and within the junction.

In essence an interdependent combination of constituents and processing steps are set forth whereby a special melt is arranged that exhibits undersaturated characteristics with respect to a substrate at an alloying temperature. The melt first etches away a portion of the substrate then becomes saturated as a result of the etched material and grows a region of a different material out of the melt. A conductivity type determining impurity in the melt forms a p-n junction in the substrate by diffusion and a graded bandgap region in the grown region forms as growth progresses. The heat cycle not only has temperature considerations for alloying and diffusion but also is of longer duration than would be needed for alloying and regrowth and this duration produces an unexpected improvement in minority carrier lifetime in the substrate and in the grown material.

The longer time cycle which produces the enhanced minority carrier lifetime results in a substantially improved device. The reason is not understood at this writing. Some explanations may be imperfection annealing, gettering of undesirable impurities and crystalline stress reduction but it may be none of these.

It will also be apparent from the above principles that the conductivity type of the ternary semiconductor can be different from that of the binary thereby producing a graded ternary semiconductor region of a conductivity type opposite to that of the binary substrate, thereby producing a structure found useful in the art.

Figure 2:
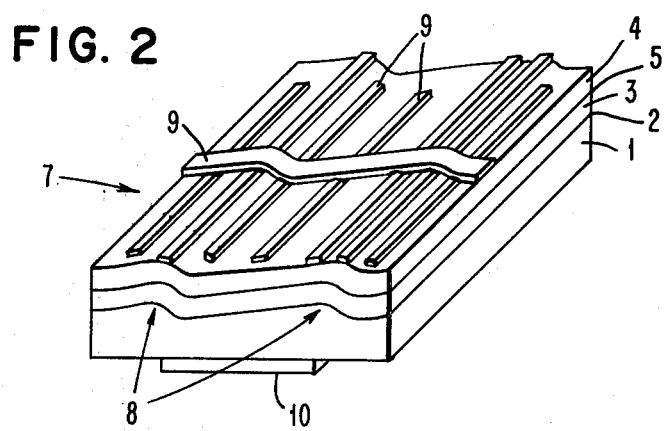
FIG. 2 is a schematic view of a solar energy converter embodiment made in accordance with the invention.
Figure 3:
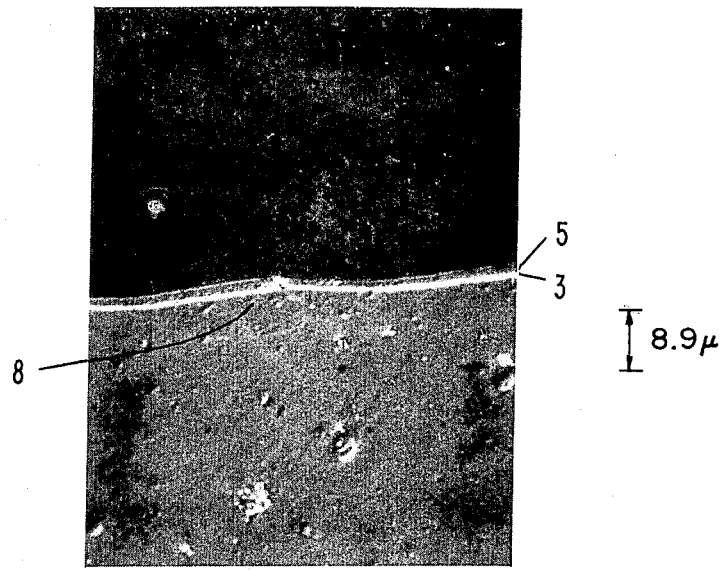
FIG. 3 is a cross-sectional photomicrograph for a p-n junction made in accordance with the invention illustrating region thickness control, junction parallelism and crystal plane variations.

Referring next to FIG. 2 a solar cell 7 embodiment of the structure in accordance with the invention is shown. The structure involves a device body having a substrate 1 forming a p-n junction 2 with a p-region 3 which in turn is contiguous at a line 5 with a region 4 of another semiconductor. Both the junction 2 and the demarcation line 5, while parallel, are shown as having step-like, crystalline plane conforming variations 8. This is the result of the etching by the melt in processing, proceeding preferentially along crystallographic planes. The variations 8 have particularly beneficial light scattering effects in devices where the region between the junction 2 and the demarcation line 5 is used for optical properties such as a laser cavity or as a solar light absorbing junction. These variations 8 may be more clearly seen by referring to the photomicrograph of FIG. 3 wherein the regions 4 and 3, while parallel, exhibit the step-like variations 8 described. The FIG. 3, having the magnification on the photograph, is of assistance in giving an appreciation of the scale to set forth the fact that the region 4 can be grown to a thickness sufficient for the drift field but thin enough to permit for all the regions of FIG. 2 to be photoactive. An external grid contact 9 is placed on the top surface and similarly an ohmic contact 10 is made to the substrate 1.

Figure 4:
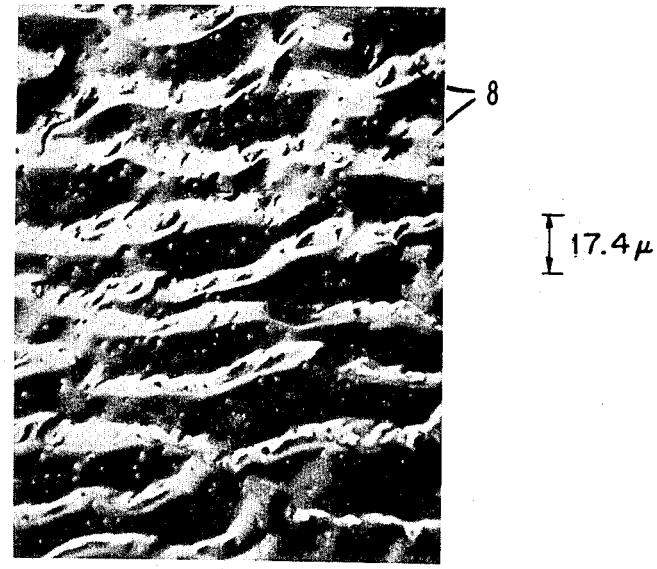
FIG. 4 is a top view photomicrograph of a surface of a device made in accordance with the invention illustrating the variations at the surface.

Referring next to FIG. 4 a top view photomicrograph bearing a magnification scale legend is provided to illustrate the variations 8 which are carried to the surface of the grown region 4.

While in the light of the teaching many specific embodiments of the invention will occur to one skilled in the art the following detailed procedure, materials and specifications are set forth as a starting place to apply the principles of the invention.

The solar cell of FIG. 2 may be constructed by employing as the substrate 1 an n-type GaAs crystal with an impurity concentration of about $1-2\times10^{17}$ atoms/cc. A melt is made up of 2.5 grams of gallium, 0.035 grams aluminum and from 0.035 to 0.100 grams of zinc. The melt is heated from 700° to 900° C. and specifically to 850° C. for example, in the presence of an excess of gallium arsenide for 30 minutes. The excess GaAs is then removed and the temperature of the melt is raised 15° C. higher or for example, to 865° C. over 850° C. The melt at this temperature is brought into contact with the substrate 1 where it is maintained from about 10 to 30 minutes and then separated. Alternatively the melt may be heated from room temperature to 700°-900° C. and specifically 850° C. in the presence of the GaAs substrate for 30 minutes and then separated. In this one growth procedure a solar cell 7 is produced in which a portion of the n-type substrate 1 is doped with Zn and converted to a 0.2 to 2.0μ thick p-type region 3 forming a p-n junction 2 and thereover a GaAlAs region that is 0.2-0.4μ thick and doped with Zn. The region 4 is equipped with a grid structure ohmic contact 9 covering 6 to 8% of the area by evaporating palladium 500 Å thick covered by aluminum 0.5μ thick. The ohmic contact 10 is made of a GaInSn alloy. The device is then annealed at 250° C. for 5 minutes to reduce resistance. An antireflective film coating of titanium dioxide, not shown, about 600 Å thick is applied over the surface of region 4.

A device produced as described above exhibits the following properties:

|  | AM0 | AM1 |
| --- | --- | --- |
| Short Circuit Current | 33 milliamperes/sq. cm. | 27.8 milliamperes/sq. cm. |
| Open Circuit Voltage | 0.99 volts | 0.976 volts |
| Fill Factor | 0.77 | 0.76 |
| Efficiency | 18.5% | 21.9% | where AM0 (Air Mass 0) is the extraterrestrial solar spectrum;
AM1 (Air Mass 1) is the terrestrial solar spectrum;
the Fill Factor is another standard measuring the device power capability.

Figure 5:
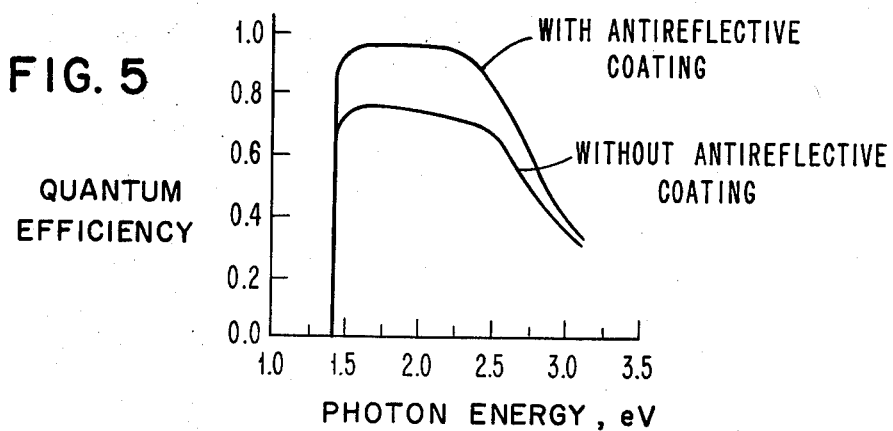
FIG. 5 is a graph of the relationship of quantum efficiency vs. photon energy for the device of FIG. 2.

Referring next to FIG. 5 the spectral response of the above-described solar cell is shown illustrating a quantum efficiency which is the number of collected photocarriers per incident photon as a function of photon energy, both with and without the antireflective coating. The curve rises rapidly from zero to nearly 1 at a photon energy of approximately 1.4 eV and corresponds to the bandgap of gallium arsenide. Above 1.4 eV the quantum efficiency remains constant and nearly unity for a broad range of photon energies illustrating the thin region 4 and the improvement in elements 3, 2 and 1 with respect to photon energies.

What has been described is a technique of semiconductor structure manufacturing wherein an unsaturated melt of a multi-ingredient semiconductor having in common at least one ingredient with a semiconductor substrate, etches a part of the semiconductor substrate and the etched material changes the melt to supersaturated at the etched interface depositing a region of the multi-ingredient semiconductor material epitaxial with the first. Impurities in the melt operate to impart conductivity type. Impurity concentration and the timing, positions a diffused junction and enhances carrier lifetime. The structure has been illustrated as a high efficiency solar cell although as will be appreciated by one skilled in the art in the light of the principles set forth, many structures may be fabricated.

What is claimed is:

1. The process of fabrication of a semiconductor structure having epitaxially contiguous regions of first and second semiconductor materials comprising in combination, the steps of contacting a substrate of a first semiconductor material with a melt of a second semiconductor material having the characteristics that the melt is undersaturated at the contacting temperature and that it becomes supersaturated as a result of the presence of said first semiconductor material dissolved into said melt, and separating said substrate and said melt.

2. The process of claim 1 wherein said first semiconductor is gallium arsenide and said second semiconductor is gallium aluminum arsenide.

3. The process of claim 2 wherein said melt contains a conductivity type determining impurity compatible with both said first and said second semiconductor materials and opposite in type to that of said substrate material.

4. The process of fabrication of a semiconductor structure having epitaxially contiguous regions of a ternary and a binary semiconductor material having at least one common ingredient comprising in combination forming an unsaturated melt of said ternary semiconductor material, at least with respect to said common ingredient, etching a portion of a binary semiconductor material with said melt, growing from said same melt a region of said ternary semiconductor material epitaxially contiguous with said binary semiconductor material, and separating said melt.

5. The process of claim 4 wherein said binary semiconductor is gallium arsenide and said ternary semiconductor is gallium aluminum arsenide.

6. The process of claim 5 wherein said melt includes a conductivity type determining impurity compatible with both said ternary and said binary semiconductor materials and opposite in type to said binary semiconductor material.

7. The process of fabricating a semiconductor structure having epitaxially contiguous regions of first and second semiconductor material comprising in combination the steps of forming a melt of a first semiconductor material at a first temperature in the presence of an excess of said second semiconductor material;

contacting a substrate of a second semiconductor material with said melt at a temperature higher than said first temperature whereby an epitaxially contiguous region of said first semiconductor material is regrown on said second semiconductor material from said melt into which a portion of said second semiconductor material has dissolved; and separating said substrate and the remains of said melt.

8. The process of claim 7 wherein said first semiconductor is gallium aluminum arsenide and said second semiconductor is gallium arsenide.

9. The process of claim 8 wherein said melt contains an impurity capable of serving as a conductivity type determining impurity in both said first and said second semiconductor materials of a type opposite to the conductivity type of said second semiconductor material, said impurity further being capable of diffusing into said second semiconductor material at said contacting temperature.

10. The process of fabricating a light-electrical energy converter comprising in combination:

forming a melt of gallium, aluminum, arsenic and zinc at a first temperature in the presence of gallium arsenide;

contacting for a period greater than 10 minutes, an n-conductivity type gallium arsenide substrate with said melt at a temperature higher than said first temperature whereby an epitaxially contiguous zinc doped p-conductivity type region of gallium aluminum arsenide is regrown on said gallium arsenide substrate from said melt in which a portion of said substrate of gallium arsenide has dissolved;

removing the remainder of said melt, and applying contacts to said gallium arsenide substrate and to a said regrown region of gallium aluminum arsenide.

* * * * *